(12) United States Patent
Mikami

(10) Patent No.: US 10,205,034 B2
(45) Date of Patent: Feb. 12, 2019

(54) OPTICAL MODULE

(71) Applicant: Mitsubishi Electric Corporation, Tokyo (JP)

(72) Inventor: Yohei Mikami, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 25 days.

(21) Appl. No.: 15/156,589

(22) Filed: May 17, 2016

(65) Prior Publication Data

US 2017/0040467 A1    Feb. 9, 2017

(30) Foreign Application Priority Data

Aug. 5, 2015  (JP) ................. 2015-154911

(51) Int. Cl.
*H01L 31/02* (2006.01)
*H01L 31/107* (2006.01)
*H04B 10/40* (2013.01)

(52) U.S. Cl.
CPC ...... *H01L 31/02027* (2013.01); *H01L 31/107* (2013.01); *H04B 10/40* (2013.01)

(58) Field of Classification Search
CPC .. H01L 31/02027; H01L 31/107; H04B 10/40
See application file for complete search history.

(56) References Cited

U.S. PATENT DOCUMENTS

| | | | | |
|---|---|---|---|---|
| 4,292,514 A * | 9/1981 | Ohtomo | ............ | H01L 31/02027 250/214 C |
| 5,625,181 A | 4/1997 | Yasuda et al. | | |
| 2003/0117121 A1 * | 6/2003 | Prescott | ................. | G05F 1/565 324/76.36 |
| 2012/0133636 A1 * | 5/2012 | Kita | ................... | H05B 33/0851 345/212 |
| 2014/0015422 A1 | 1/2014 | Ye | | |

FOREIGN PATENT DOCUMENTS

| | | |
|---|---|---|
| JP | Hei07-245540 A | 9/1995 |
| JP | Hei11-275755 A | 10/1999 |
| JP | 2015-115644 A | 6/2015 |

OTHER PUBLICATIONS

An Office Action issued by the Taiwanese Patent Office dated Mar. 13, 2017, which corresponds to Taiwanese Patent Application No. 105115134; with partial English language translation.
An Office Action issued by the Korean Patent Office dated Dec. 29, 2017, which corresponds to Korean Patent Application No. 10-2016-0099216 and is related to U.S. Appl. No. 15/156,589.

(Continued)

*Primary Examiner* — Georgia Y Epps
*Assistant Examiner* — Don Williams
(74) *Attorney, Agent, or Firm* — Studebaker & Brackett PC

(57) ABSTRACT

An optical module includes: an avalanche photodiode; a power supply terminal; a self bias resistor connected between a cathode of the avalanche photodiode and the power supply terminal; a grounding terminal; and a surge preventing Zener diode having a cathode connected to a connection point between the power supply terminal and the self-bias resistor and an anode directly connected to the grounding terminal.

9 Claims, 2 Drawing Sheets

(56) References Cited

OTHER PUBLICATIONS

An Office Action issued by the Chinese Patent Office dated Feb. 23, 2018, which corresponds to Chinese Patent Application No. 20161065926.5. and is related to U.S. Appl. No. 15/156,583; with English translation.
An Office Action dated by the Korean Intellectual Property Office dated Jul. 30, 2018, which corresponds to Korean Patent Application No. 10-2016-0099216 and is related to U.S. Appl. No. 15/156,589.
An Office Action issued by the Chinese Patent Office (SIPO) dated Oct. 9, 2018, which corresponds to Chinese Patent Application No. 201610639226.5 and is related to U.S. Appl. No. 15/156,589.

* cited by examiner

OPTICAL MODULE

BACKGROUND OF THE INVENTION

Field

The present invention relates to an optical module for optical communication provided with an APD (avalanche photodiode).

Background Conventional optical modules include a resistor connected between a power supply terminal and a cathode of an APD and a cathode of a surge preventing Zener diode connected to a connection point between the resistor and the cathode of the APD (e.g., see Japanese Patent Laid-Open No. 11-275755).

When a surge is inputted, if a cathode voltage of the APD is less than a breakdown voltage of the Zener diode, a surge current flows through the APD, not the Zener diode. When strong light is made incident on the APD, a voltage drop of the resistor causes the cathode voltage of the APD to decrease, and a difference from the breakdown voltage of the Zener diode expands, resulting in a problem that a surge current is more likely to flow through the APD.

SUMMARY

The present invention has been implemented to solve the above-described problem and it is an object of the present invention to provide an optical module capable of achieving stable surge resistance regardless of whether or not light is made incident.

According to the present invention, an optical module includes: an avalanche photodiode; a power supply terminal; a self-bias resistor connected between a cathode of the avalanche photodiode and the power supply terminal; a grounding terminal; and a surge preventing Zener diode having a cathode connected to a connection point between the power supply terminal and the self-bias resistor and an anode directly connected to the grounding terminal.

In the present invention, since the Zener diode is directly connected to the power supply terminal, there is no influence from the self-bias resistor. Therefore, it is possible to achieve stable surge resistance regardless of whether or not light is made incident.

Other and further objects, features and advantages of the invention will appear more fully from the following description.

DESCRIPTION OF EMBODIMENTS

An optical module according to the embodiments of the present invention will be described with reference to the drawings. The same components will be denoted by the same symbols, and the repeated description thereof may be omitted.

First Embodiment

Figure 1:
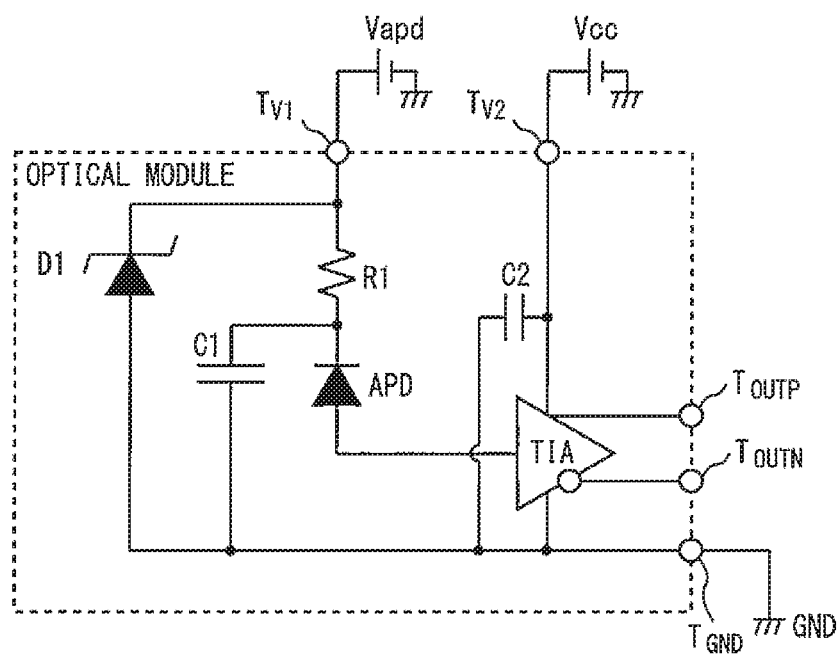
FIG. 1 is a diagram illustrating an optical module according to a first embodiment of the present invention.

FIG. 1 is a diagram illustrating an optical module according to a first embodiment of the present invention. A self-bias resistor R1 is connected between a cathode of an avalanche photodiode APD and a power supply terminal $T_{v1}$. Therefore, the APD and the self-bias resistor R1 are connected in series and a voltage is supplied to the APD from the power supply terminal $T_{v1}$ via the self-bias resistor R1.

A trans-impedance amplifier TIA is connected to an anode of the APD. When light is made incident on the APD, a photoelectric current flows through the APD. The TIA amplifies the photoelectric current and outputs a differential output from output terminals $T_{OUTP}$ and $T_{OUTN}$.

One end of a noise cancellation capacitor C1 is connected to a connection point between the APD and the self-bias resistor R1 and the other end is connected to a grounding terminal $T_{GND}$. One end of a capacitor C2 is connected to a connection point between the TIA and a power supply terminal $T_{v2}$ and the other end is connected to the grounding terminal $T_{GND}$.

A cathode of a surge preventing Zener diode D1 is connected to a connection point between the power supply terminal T and the self-bias resistor R1, and an anode is directly connected to the grounding terminal $T_{GND}$. That is, no other circuit element such as a switch is connected between the anode of the Zener diode D1 and the grounding terminal $T_{GND}$, and both are electrically connected via only a wire.

The grounding terminal $T_{GND}$ is grounded via a wire outside the optical module. A supply voltage $V_{apd}$ (85 V) is applied to the power supply terminal $T_{v1}$ from a power supply outside the optical module. A supply voltage $V_{cc}$ is applied to the power supply terminal $T_{v2}$ from a power supply outside the optical module. A breakdown voltage $V_z$ and the supply voltage $V_{apd}$ are set so that the breakdown voltage $V_z$ of the Zener diode D1 is greater than the supply voltage $V_{apd}$ ($V_z > V_{apd}$).

Thus, in the present embodiment, when a surge exceeding the breakdown voltage $V_z$ of the Zener diode D1 is applied to the optical module, a surge current flows from the power supply terminal $T_{v1}$ to the Zener diode D1 side, making it possible to protect the APD. Moreover, since the Zener diode D1 is directly connected to the power supply terminal $T_{v1}$, there is no influence from the self-bias resistor R1 and even when a photoelectric current flows through the APD, $V_{apd} - V_z$ is kept constant. Therefore, even in the case where a photoelectric current flows through the APD, it is possible to achieve surge resistance equivalent to that in the case where a photoelectric current does not flow through the APD. That is, it is possible to achieve stable surge resistance regardless of whether or not light is made incident. Moreover, since the self-bias resistor R1 is incorporated in the optical module, it is possible to downsize the circuit on the optical transmitter/receiver side.

Note that when a surge voltage from outside the optical module is equal to or greater than $V_{apd}$ and less than $V_z$, no current flows through the Zener diode D1 side but the surge current flows through the APD, and it is therefore preferable to set $V_{apd}$ and $V_z$ to the closest possible values.

Second Embodiment

Figure 2:
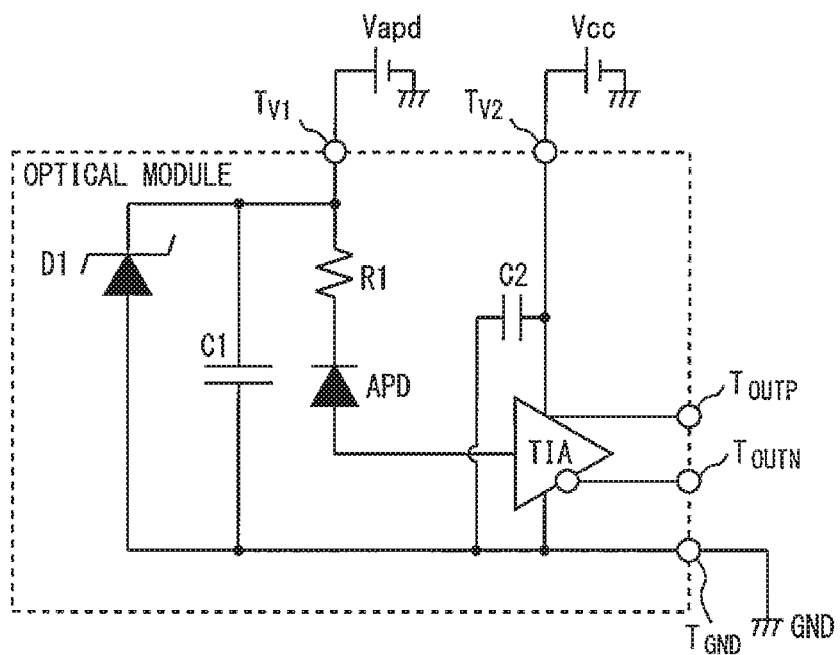
FIG. 2 is a diagram illustrating an optical module according to a second embodiment of the present invention.

FIG. 2 is a diagram illustrating an optical module according to a second embodiment of the present invention. In the present embodiment, one end of the noise cancellation capacitor C1 is connected to a connection point between the power supply terminal $T_{v1}$ and the self-bias resistor R1 and the other end is connected to the grounding terminal $T_{GND}$, and connected in parallel to the Zener diode D1. The rest of the configuration is similar to that of the first embodiment and effects similar to those of the first embodiment can be obtained.

Here, in the first embodiment, when light having a short rise time is inputted, a photoelectric current drastically fluctuates and the amount of voltage drop at the self-bias resistor R1 also drastically fluctuates. This causes the voltage at the connection part between the capacitor C1 and the self-bias resistor R1 to fluctuate and causes charge stored in the capacitor C1 to drastically flow toward the APD, increasing a possibility that the APD may malfunction.

On the other band, in the present embodiment, the capacitor C1 is directly connected to the power supply terminal $T_{v1}$, which prevents influences of fluctuation in the amount of voltage drop at the self-bias resistor R1. Therefore, even when light is made incident on the APD, no transient current directed to the APD is generated, making it possible to prevent the APD from malfunctioning.

Third Embodiment

Figure 3:
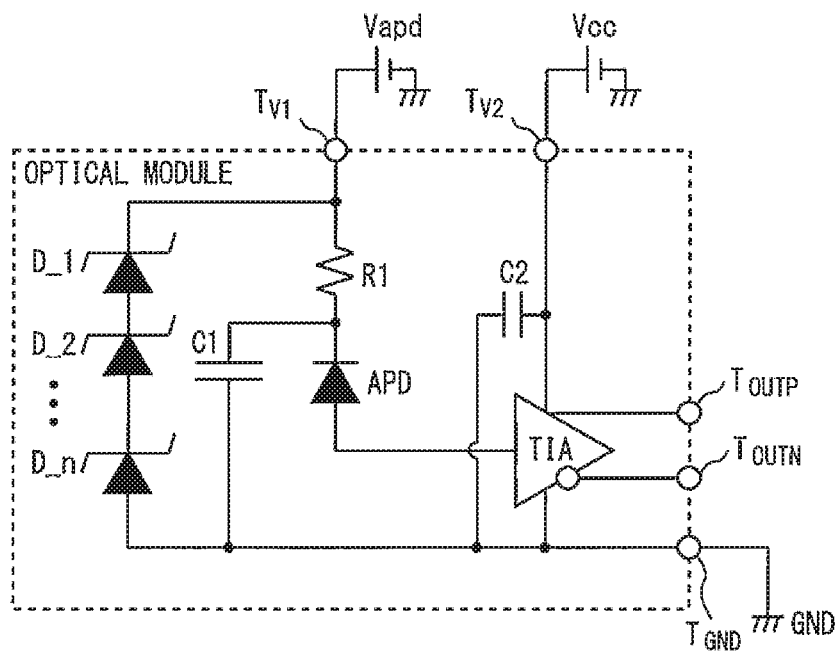
FIG. 3 is a diagram illustrating an optical module according to a third embodiment of the present invention.

FIG. 3 is a diagram illustrating an optical module according to a third embodiment of the present invention. The present embodiment uses a plurality of Zener diodes D_1 to D_n (n is any given integer equal to or greater than 2) connected in series to each other instead of the Zener diode D1. The rest of the configuration is similar to that of the first embodiment. The sum of breakdown voltages of the plurality of Zener diodes D_1 to D_n, that is, a value $V_{z\_1}+V_{z\_2}\ldots+V_{z\_n}$ is greater than the supply voltage $V_{apd}$, and stable surge resistance is achieved by causing this value to approximate to the supply voltage $V_{apd}$ as much as possible.

Fourth Embodiment

Figure 4:
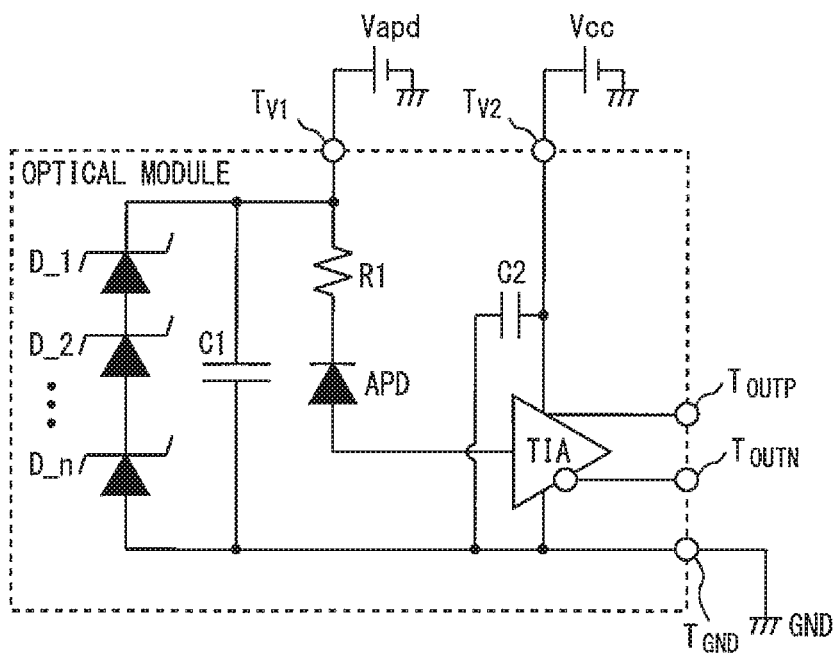
FIG. 4 is a diagram illustrating an optical module according to a fourth embodiment of the present invention.

FIG. 4 is a diagram illustrating an optical module according to a fourth embodiment of the present invention. The present embodiment uses a plurality of Zener diodes D1 to Dn (n is any given integer equal to or greater than 2) connected in series to each other instead of the Zener diode D1. The rest of the configuration is similar to that of the second embodiment. The sum of breakdown voltages of the plurality of Zener diodes D_1 to D_n, that is, a value $V_{z\_1}+V_{z\_2}\ldots+V_{z\_n}$ is greater than the supply voltage $V_{apd}$, and stable surge resistance is achieved by causing this value to approximate to the supply voltage $V_{apd}$ as much as possible.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2015-154911, filed on Aug. 5, 2015 including specification, claims, drawings and summary, on which the Convention priority of the present application is based, is incorporated herein by reference in its entirety.

The invention claimed is:
1. An optical module comprising:
an avalanche photodiode;
a power supply terminal;
a self-bias resistor connected between a cathode of the avalanche photodiode and the power supply terminal;
a grounding terminal; and
a surge preventing Zener diode having a cathode directly connected to the power supply terminal at a connection point between the power supply terminal and the self-bias resistor and an anode directly connected to the grounding terminal.
2. The optical module of claim 1, further comprising a noise cancellation capacitor having a first end connected to a connection point between the avalanche photodiode and the self-bias resistor and a second end connected to the grounding terminal.
3. The optical module of claim 1, further comprising a noise cancellation capacitor having a first end connected to a connection point between the power supply terminal and the self-bias resistor and a second end connected to the grounding terminal, and connected in parallel to the Zener diode.
4. The optical module of claim 1, wherein the Zener diode includes a plurality of Zener diodes connected in series to each other.
5. The optical module of claim 1, wherein
the grounding terminal is grounded, and
a breakdown voltage of the Zener diode is greater than a supply voltage applied to the power supply terminal.
6. An optical module comprising:
an avalanche photodiode;
a power supply terminal;
a self-bias resistor connected between a cathode of the avalanche photodiode and the power supply terminal;
a grounding terminal; and
a surge preventing Zener diode having a cathode connected to a connection point between the power supply terminal and the self-bias resistor and an anode directly connected to the grounding terminal, wherein
the grounding terminal is grounded, and
a breakdown voltage of the Zener diode is greater than a supply voltage applied to the power supply terminal,
when a surge voltage exceeding the breakdown voltage of the Zener diode is applied to the optical module, a surge current flowing from the power supply terminal is diverted from the avalanche photodiode to the Zener diode.
7. The optical module of claim 6, further comprising a noise cancellation capacitor having a first end connected to a connection point between the avalanche photodiode and the self-bias resistor and a second end connected to the grounding terminal.
8. The optical module of claim 6, further comprising a noise cancellation capacitor having a first end connected to a connection point between the power supply terminal and the self-bias resistor and a second end connected to the grounding terminal, and connected in parallel to the Zener diode.
9. The optical module of claim 6, wherein the Zener diode includes a plurality of Zener diodes connected in series to each other.

* * * * *